United States Patent [19]

Yoshizumi et al.

[11] Patent Number: 4,816,983
[45] Date of Patent: * Mar. 28, 1989

[54] ENCLOSED D.C. CONVERTING STATION

[75] Inventors: Toshiaki Yoshizumi; Isao Nishio, both of Osaka, Japan

[73] Assignee: Mitsubishi Denki Kabushiki Kaisha, Tokyo, Japan

[*] Notice: The portion of the term of this patent subsequent to May 24, 2005 has been disclaimed.

[21] Appl. No.: 745,426

[22] Filed: Jun. 17, 1985

[30] Foreign Application Priority Data

Jun. 20, 1984 [JP] Japan ................................ 59-126959

[51] Int. Cl.$^4$ ........................ H02H 7/125; H02M 7/04
[52] U.S. Cl. ...................................... 363/54; 363/141; 361/385
[58] Field of Search ........................ 363/53, 54, 69, 70, 363/141; 361/381, 382, 385, 2, 115, 120, 121, 129, 130, 331, 333, 335, 341

[56] References Cited

U.S. PATENT DOCUMENTS

| 4,005,345 | 1/1977 | Kane et al. ........................ 361/335 |
| 4,382,276 | 5/1983 | Menju et al. ..................... 363/141 |
| 4,503,481 | 3/1985 | Fujiya et al. .................... 361/333 |

FOREIGN PATENT DOCUMENTS

| 197803 | 3/1978 | Fed. Rep. of Germany ...... 363/141 |
| 86483 | 8/1983 | Fed. Rep. of Germany ...... 363/141 |
| 53-38027 | 10/1978 | Japan ............................... 363/141 |
| 58-45243 | 10/1983 | Japan . |
| 58-186302 | 10/1983 | Japan . |
| 58-204704 | 11/1983 | Japan . |

OTHER PUBLICATIONS

Development of HVDC Thyristor Valve Insulated and Cobled by Compressed SF$_6$ Gas, Matsumura et al., IEEE 1983.

Primary Examiner—Patrick R. Salce
Assistant Examiner—Judson H. Jones
Attorney, Agent, or Firm—Wenderoth, Lind & Ponack

[57] ABSTRACT

This invention relates to an enclosed D.C. converting station having enclosed 3-arm integral type bulbs constructed integrally with bulbs for three arms of the same polarity side of bulb arms for forming a 3-phase bridge circuit.

1 Claim, 6 Drawing Sheets

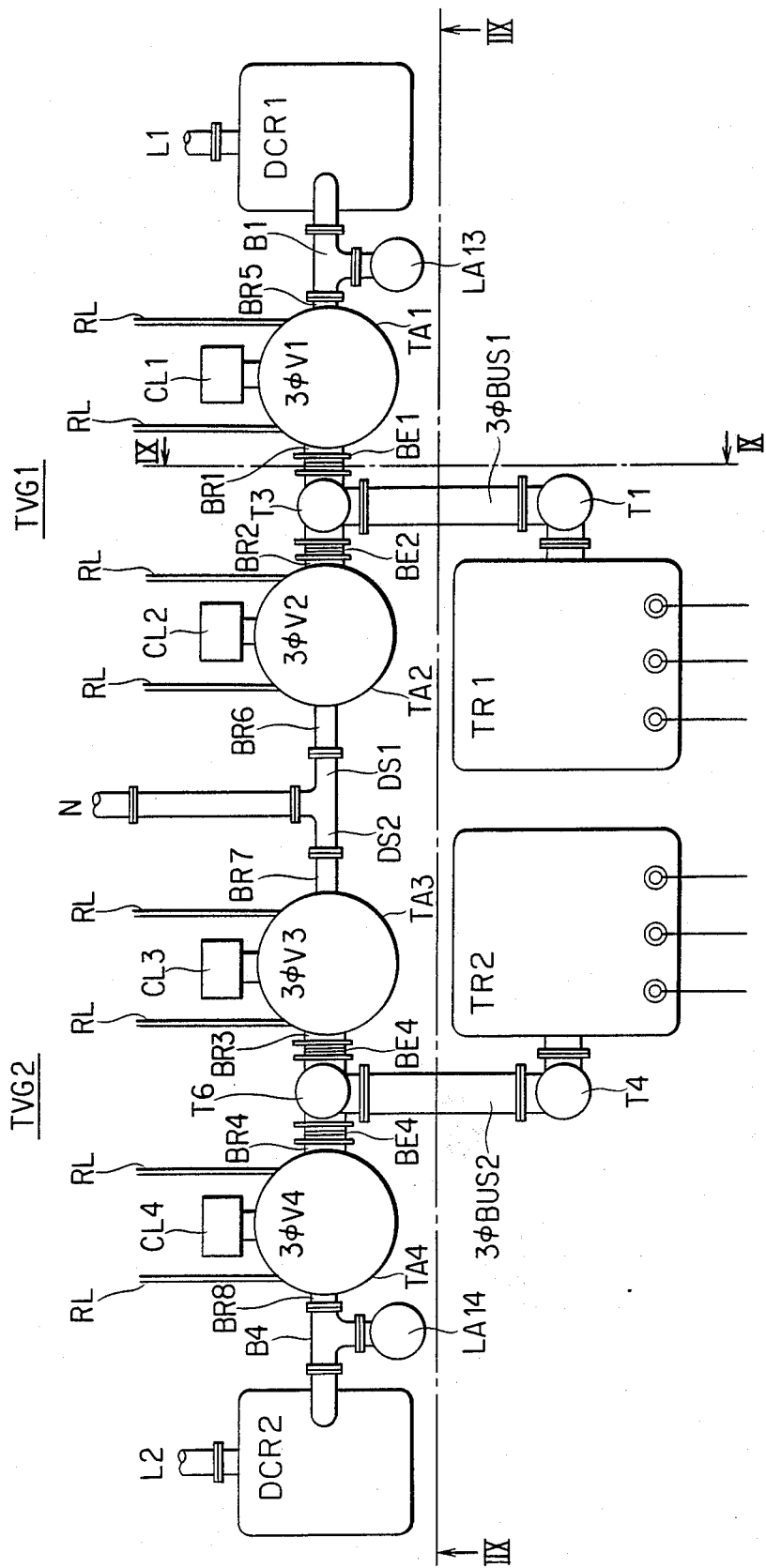

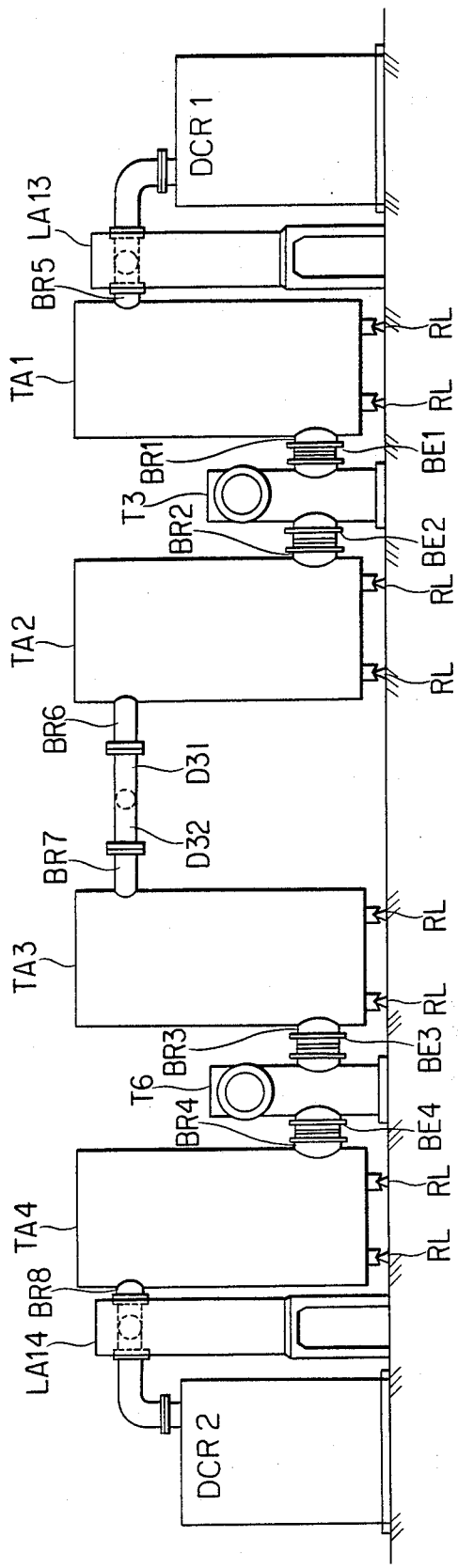
FIG. 8 (IX-IX)
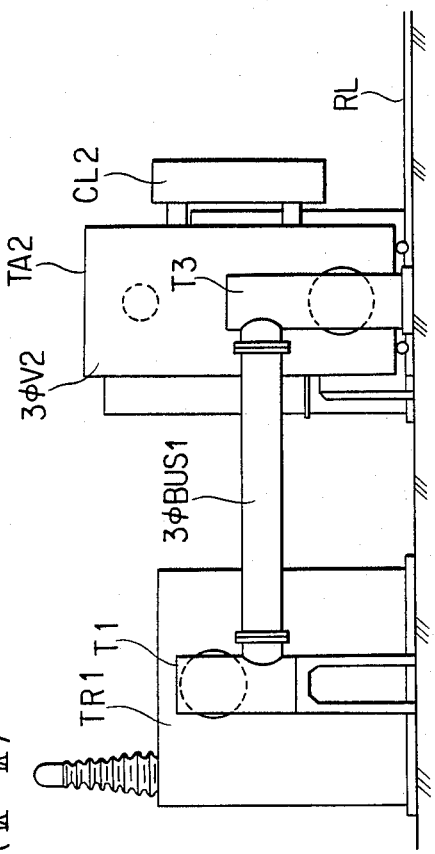
FIG. 9 (IX-IX)

ENCLOSED D.C. CONVERTING STATION

BACKGROUND OF THE INVENTION

This invention relates to an A.C.-D.C. or D.C.-A.C. converting station (hereinbelow referred to as "D.C." converting station) in a D.C. power transmission. More specifically, it relates to an enclosed D.C. converting station useful for reducing the installing area and simplifying the structure.

Recently, a D.C. power transmission system which has various advantages such as an inexpensive line construction cost as compared with an A.C. power transmission system have been employed in a practical use. An indoor type, an air insulating type or an indoor air cooling type has heretofore been adopted for a thyristor bulb for rectifying alternating current into direct current of devices in a D.C. converting station of this D.C. power transmission system, and the thyristor bulb and control devices belonging to the bulb have been frequently contained in a building.

On the other hand, a thyristor bulb which is cooled by insulating oil or gas has recently been employed in a practical use due to the request of increasing the capacity or raising the voltage. As a result of such a practical use of an enclosed thyristor bulb, the study of the devices in the converting station, i.e., a current transformer for a D.C. instrument, a transformer for a D.C. instrument, a transformer, a reactor, a lightning unit, a disconnecting switch, buses are all enclosed, so-called an enclosed D.C. converting station has been proceeded, and the construction of a test plant and a proving test has also been advanced.

First of advantages of enclosing the D.C. converting station is a point of improving a contamination resistance performance from the external environment of a charger. As a result, the reliability of various devices can be improved. Second of the advantages is a point of shortening an insulating distance by the action of insulating oil or gas, resulting in a reduction of the entire converting station.

Heretofore, in a substation for an A.C. power transmission, the substation is enclosed, and reduced in size by employing gas insulation for electric devices so as to remedy a difficulty of obtaining a site, a public pollution, a contamination, an earthquake, etc. The disposition of the electric devices in the substation is most important in the substation. Periodic inspection and maintenance are conducted mainly for circuit breakers. From this point of view, it is desired to consider the disposition of the devices mainly for the thyristor bulb of the most important device in the D.C converting station.

FIG. 1 is an example of a plan view showing the disposition of devices in a proposed conventional enclosed D.C. converting station, FIG. 2 is a side view of FIG. 1, and FIG. 3 is a circuit diagram of a min circuit of FIG. 1. In FIGS. 1 and 3, characters TR1, TR2 designate transformers, and characters TVG1, TVG2 thyristor bulb group of ±250 kV when the converting station of this example is ±250 kV. Character V1 to V12 indicate thyristor bulbs which construct the thyristor bulb group. The groups TVG1 and TVG2 are connected in series to form a series connection unit. Characters LA1 to LA12 denote lightning arresters for protecting the thyristor bulbs V1 to V12 against an overvoltage, characters DCR1 and DCR2 D.C. reactors, characters LA13, LA14 lightning arresters of the terminals of the reactors DCR1, DCR2, and characters L2, L1 ±250 kV D.C. power transmission lines.

A.C side 3-phase buses R, S, T and U, V, W are disposed perpendicularly, as shown in FIG. 1, at the center in the D.C. converting station. The thyristor bulb V1, V2, V3 and V4, V5, V6 of the thyristor bulb group TVG1 are disposed at both sides of the buses R, S, T. The thyristor bulbs V7, V8, V9 and V10, V11, V12 of the thyristor bulb group TVG2 are disposed at both sides of the A.C. side 3-phase buses U, V, W.

The positive (+) D.C. side bus B4 of the thyristor bulb group TVG2 is disposed to be superposed on the upper position of the A.C. side 3-phase bus U, and the negative (−) D.C. side bus B1 of the thyristor bulb group TVG1 is disposed to be superposed on the upper position of the A.C. side 3-phase bus T (See FIG. 2). The common D.C. side bus B2 and B3 of the positive (+) side and negative (−) side of the thyristor bulb groups TVG1 and TVG2 are respectively disposed linearly to be superposed on the upper positions of the A.C side 3-phase buses R, W.

Disconnecting switches DS1, DS2 are respectively disposed in the course of the D.C. side buses B2, B3. A neutral line N is led substantially in parallel with the D.C. power transmission lines L1, L2 from between the both disconnecting switches DS1 and DS2.

The enclosed D.C converting station constructed as described above is considerably reduced as compared with the gas insulating type D.C. converting station, but still has such a disadvantage to require an extremely large site since the bulb arm units are separated from each other.

SUMMARY OF THE INVENTION

This invention has been made in order to eliminate the disadvantages mentioned above, and has for its object to provide an enclosed D.C. converting station in which the bulb 3 arms of the same polarity side are simultaneously contained as an enclosed 3-arm integral bulb, thereby reducing the installing area and simplifying the structure.

BRIEF DESCRIPTION OF THE DRAWINGS

FIG. 7 is a plan view showing still another embodiment of the invention;

FIG. 8 is a sectional view, taken along the line IIX—IIX of FIG. 7; and

FIG. 9 is a sectional view, taken along the line IX—IX of FIG. 7.

In the drawings, the same symbols indicate the same or corresponding parts.

DESCRIPTION OF THE PREFERRED EMBODIMENTS

Figure 3:
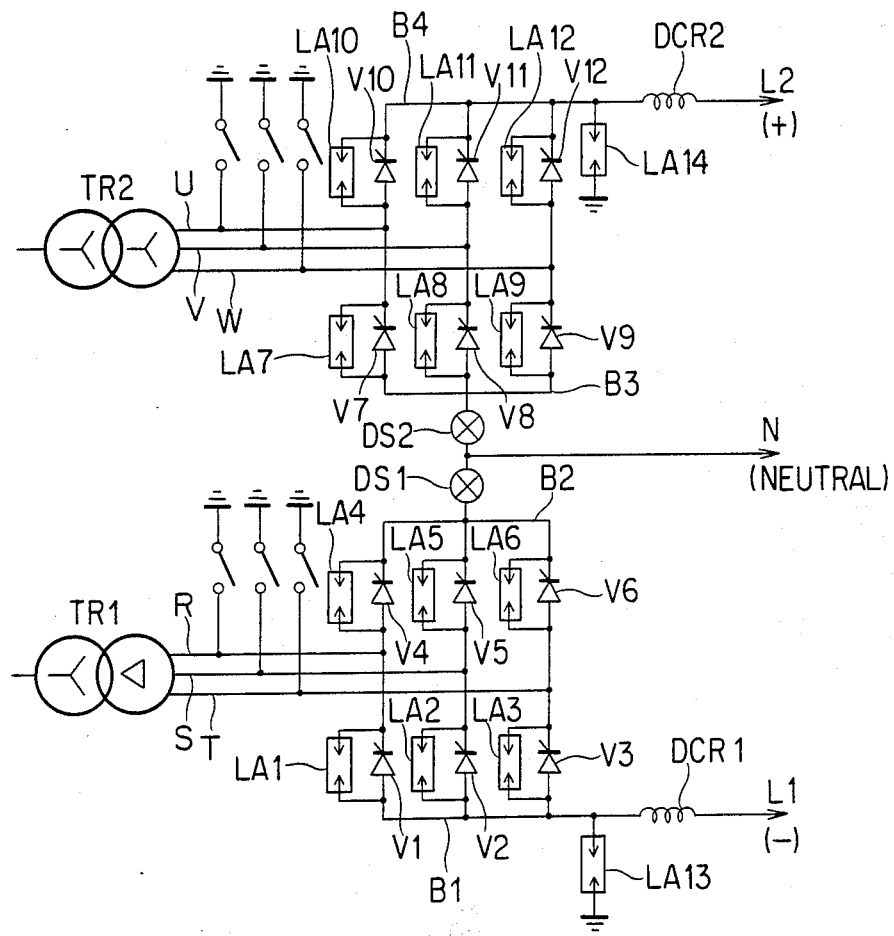
FIG. 3 is a circuit diagram of a main circuit in the D.C. converting station.
Figure 4:
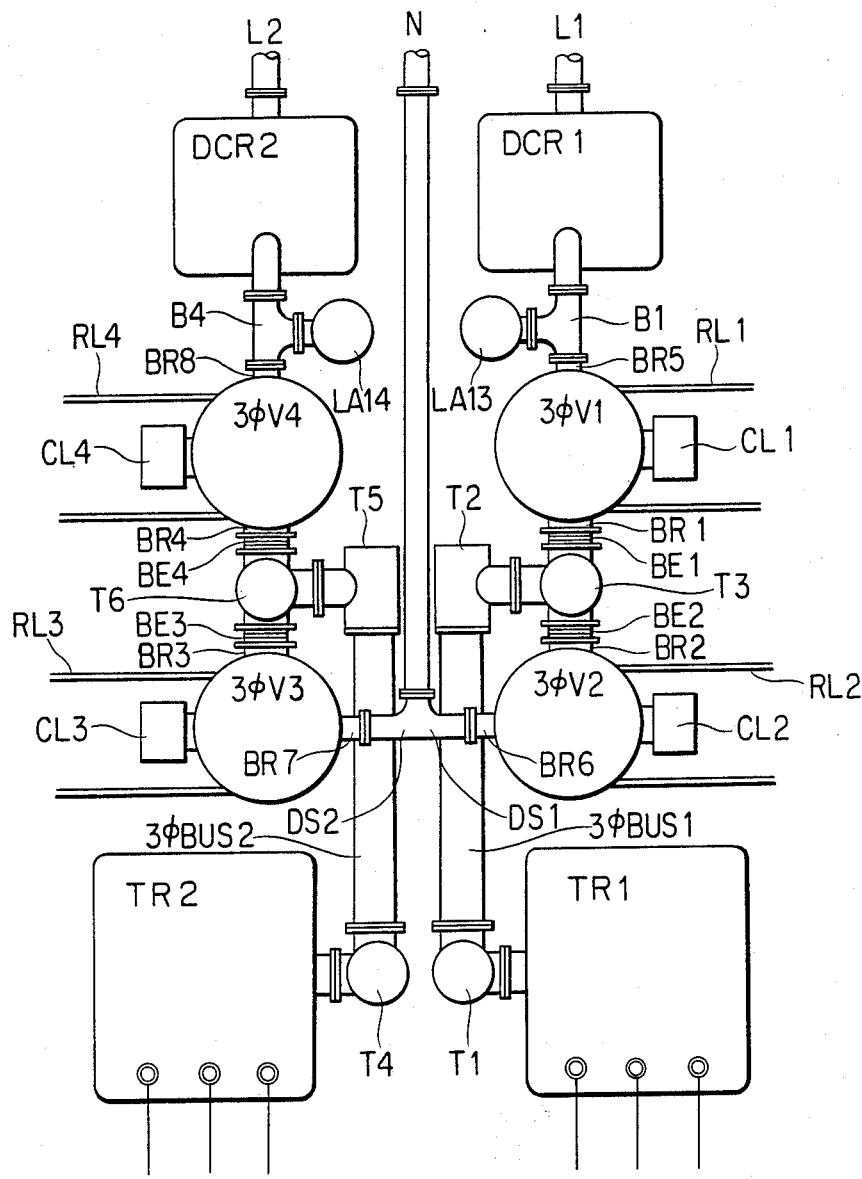
FIG. 4 is a plan view of an embodiment of an enclosed D.C. converting station according to this invention.
Figure 5:
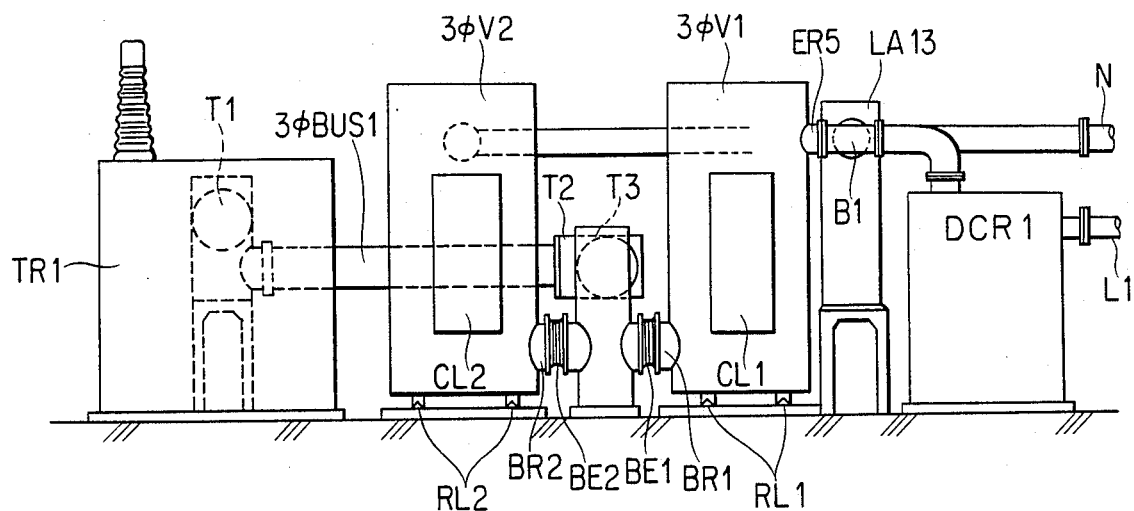
FIG. 5 is a side view of FIG. 4.

Now, an embodiment of this invention will be described with reference to the drawings. FIG. 4 is a view showing the disposition of an embodiment of an enclosed D.C converting station according to this invention, and FIG. 5 is a side view of FIG. 4. In FIGS. 4 and 5, the same numerals indicate the same or corresponding parts in FIGS. 1 to 3, and the detailed description will be omitted. In FIG. 4, characters 3φV1, 3φV2, 3φV3, 3φV4 designate 3-arm integral type bulbs. These bulbs are contained together with three arresters connected in parallel with the three arms of the bulbs of the same polarity side in an enclosed container. The 3-arm integral type bulb (hereinbelow referred to as "a bulb") 3φV1 contains parts corresponding to the thyristor bulbs V1, V2, V3, and lightning arresters LA1, LA2, LA3 in FIGS. 1 and 3. The bulb 3φV2 similarly contains parts corresponding to the thyristor bulbs V4, V5, V6, and lightning arresters LA4, LA5, LA6. The bulb 3φV3 similarly contains parts corresponding to the thyristor bulbs V7, V8, V9, and lightning arresters LA7, LA8, LA9, and the bulb 3φV4 similarly contain parts corresponding to the thyristor bulbs V10, V11, V12, and lightning arresters LA10, LA11, LA12. The bulbs 3φV1, 3φV2, 3φV3, 3φV4 are arranged so that, when the central points are connected, they become a rectangular shape.

The one ends of the 3-phase integral bus 3φBUS1, 3φBUS2 are respectively connected through phase rotary buses T1, T4 to transformers TR1, TR2 for the converter. The other ends of the 3-phase integral bus T2 3φBUS1 is connected through a phase rotary bus T2 to a phase rotary bus T3. The bus T3 is connected through the bulb 3φV1 and bellows BE1 disposed at one side of the bus T3 and a branch tube BR1, and connected through the bulb 3φV2 and bellows BE2 disposed at the other side and a branch tube BR2. The other end of the bus 3φBUS2 is connected through a phase rotary bus T5 to a phase rotary bus T6. This bus T6 is connected through the bulb 3φV3 and the bellows BE3 disposed at one side of the tube T6 and a branch tube BR3, and connected through the bulb 3φV4 and bellows BE4 disposed at the other side and a branch tube BR4.

The D.C bus sides of the bulbs 3φV1, 3φV3, 3φV4 are all connected to the one ends of the three arresters at the bulbs of three arms contained therein to become conductors. A branch tube BR6 connected to the conductor of the bulb 3φV2 of these conductors is connected through a disconnecting switch DS1 to the neutral bus N. A branch tube BR7 connected to the conductor of the bulb 3φV3 is connected through a disconnecting switch DS2 to the neutral bus N. A lightning arrester LA13 for protecting a DC reactor DCR1 is connected to the D.C side bus B1. One end of the bus B1 is connected to a branch tube 5 connected to the conductor of the bulb 3φV1, and the other end of the bus B1 is connected to the D.C reactor DCR1. A lightning arrester LA14 for protecting a D.C. reactor DCR2 is connected to the bus B4. One end of the bus B4 is connected to a branch tube bR8 connected to the conductor of the bulb 3φV4, and the other end of the bus B4 is connected to the reactor DCR2. A D.C. power transmission line L1 is led from the reactor DCR1, and a D.C power transmission line L1 is led from the reactor DCR2. The buses B1, B4 and the neutral bus N are all disposed at the upper position to the A.C. side 3-phase integral buses 3φBUS1, 3φBUS2.

Coolers CL1, CL2, CL3, CL4 are respectively provided in the bulbs 3φV1, 3φV2, 3φV3, 3φV4, and the heats generated from the bulb 3V1, 3φV2, 3φV3, 3φV4 are externally dissipated via cooling medium such as insulating oil or gas. The bulbs 3φV1, 3φV2, 3φV3, 3φV4 are respectively placed on rails RL1, RL2, RL3, RL4 for leading the bulbs 3φV1, 3φV2, 3φV3, 3φV4.

In the enclosed D.C. converting station constructed as described above, the installing area can be reduced, and the structure can be simplified by constructing the bulbs 3φV1, 3φV2, 3φV3, 3φV4 in the enclosed 3-arm integral type bulb.

The A.C. 3-phase integral buses 3φBUS1, 3φBUS2 are associated with the bulbs 3φV1, 3φV2, 3φV3, 3φV4, thereby simplifying the disposition of the buses and simultaneously stereoscopically disposing the D.C. side buses and the A.C. side buses. Thus, the installing area of the entire D.C. converting station can be remarkably reduced in addition to the effects of the 3-arm integration of the bulbs 3φV1, 3φV2, 3φV3, 3φV4 and the 3-phase integration of the buses 3φBUS1, 3φBUS2.

Further, when a necessity of disassembling and assembling the bulb 3φV1 incurs, for example, for its maintenance and inspection, the branch tube BR1 is separated from the bellows BE1, and the branch tube BR5 is isolated from the bus B1, and the bulb 3φV1 is led out along the rail RL1, thereby disassembling and assembling the bulb 3φV1. Thus, the works can be efficiently performed.

Figure 6:
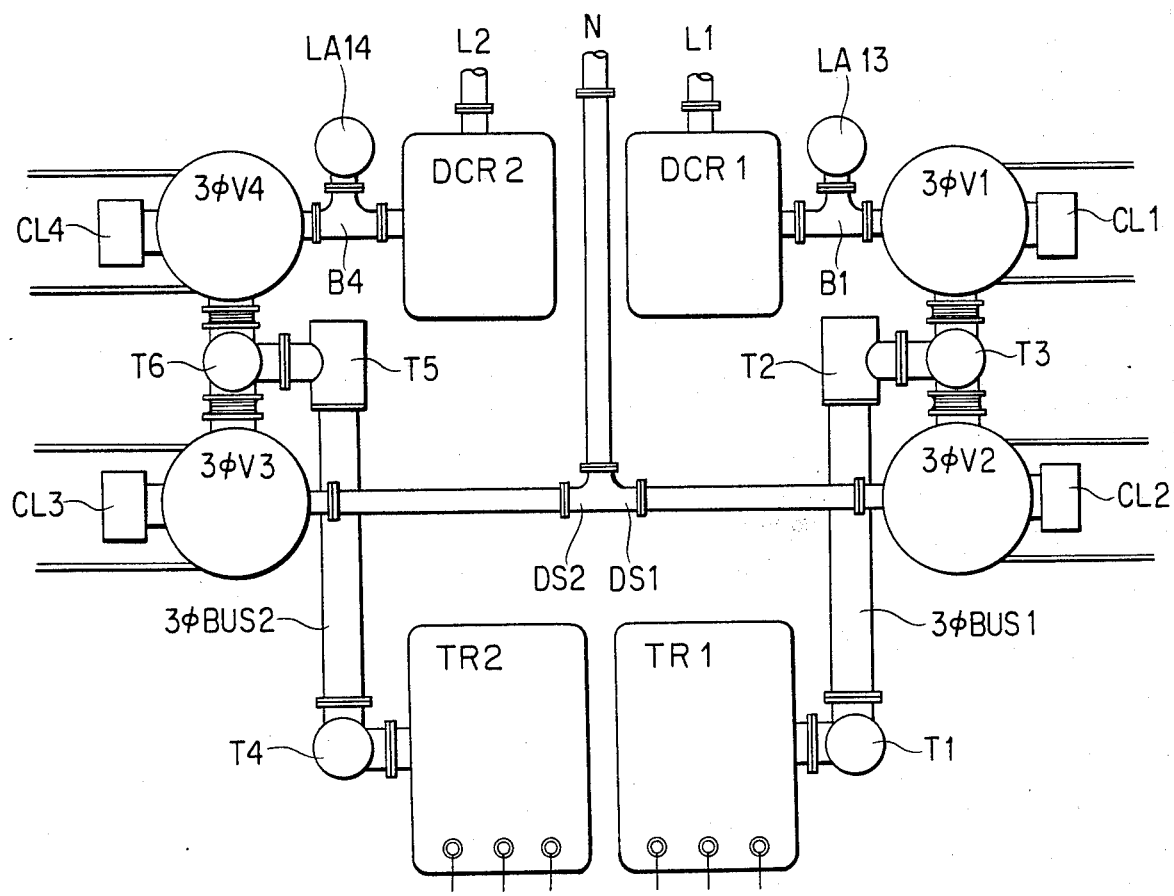
FIG. 6 is a plan view showing another embodiment of the invention.

FIG. 6 shows another embodiment of this invention. In this embodiment, intervals between D.C. reactors DCR1, DCR2 and transformers TR1, TR2 for the converter are shortened, bulbs 3φV1, 3φV2, 3φV3, 3φV4 are so disposed at both sides of the D.C. reactors DCR1, DCR2 and the transformers TR1, TR2 for a converter as to form a rectangular shape by connecting the centers of the bulbs 3φV1, 3φV2, 3φV3, 3φV4, thereby simplifying the enclosed D.C. converting station and reducing the installing area.

FIGS. 7, 8 and 9 show still another embodiment of the invention in which four 3-arm integral type bulbs are disposed substantially along a rectilinear line. FIG. 8 is a sectional view, taken along the line IIX—IIX of FIG. 7, and FIG. 9 is a sectional view, taken along the line IX—IX of FIG. 7.

Figure 1:
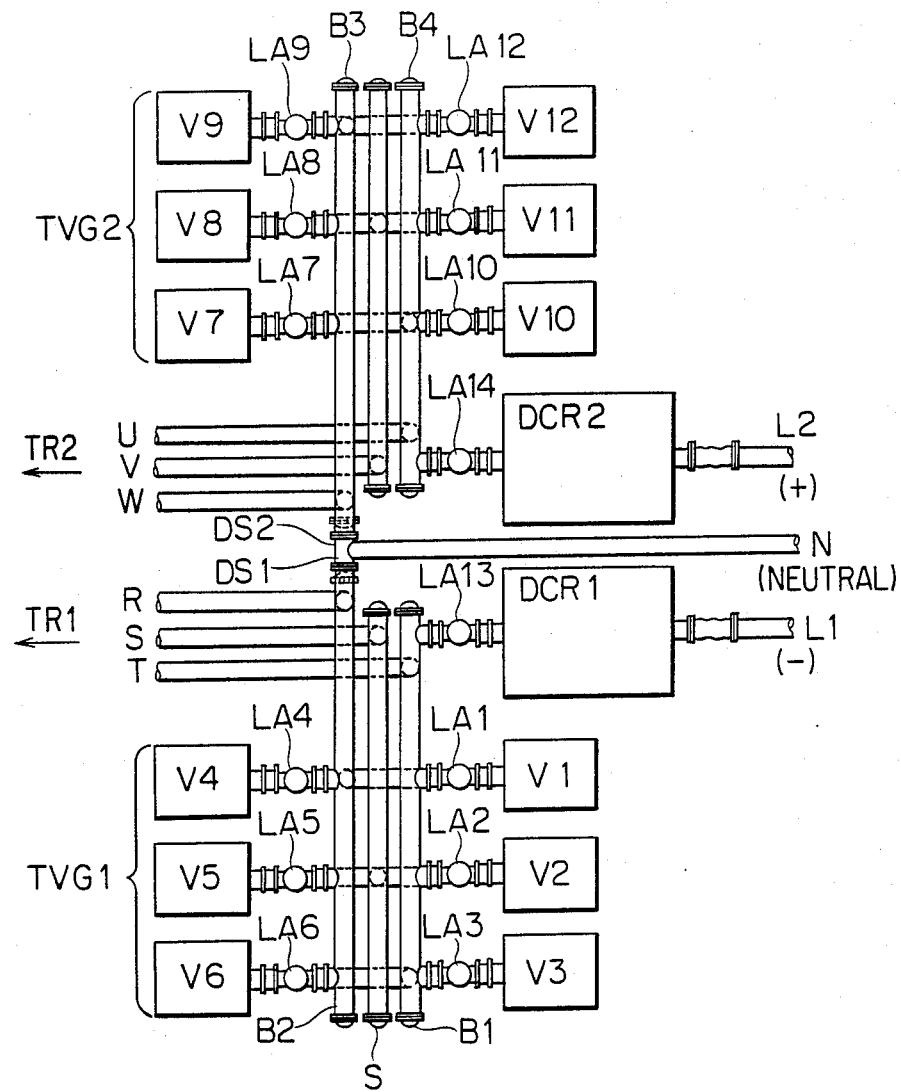
FIG. 1 is a plan view of a conventional enclosed D.C. converting station.
Figure 2:
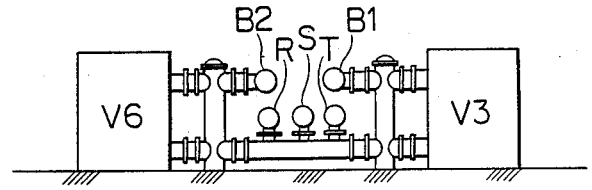
FIG. 2 is a side view of FIG. 1.

The same numerals indicate the same or equivalent parts as in FIGS. 1 and 2, and detailed description will be omitted.

In FIGS. 7, 8 and 9, characters 3φV1, 3φV2, 3φV3, 3φV4 designate 3-arm integral type bulbs in which thyristor bulbs for three arms connected to the same D.C. polarity side are contained together with three lightning arresters connected in parallel with each other in one respective enclosed containers TA1, TA2, TA3, TA4. In this embodiment, four 3-arm integral typeb-bulbs are disposed substantially along a rectilinear line. The bulb 3φV1 contains therein parts corresponding to V1, V2, V3, and LA1, LA2, LA3 of FIGS. 1 and 2, the bulb 3φV2 contains therein parts corresponding to V4, V5, V6, and LA4, LA5, LA6, the bulb 3φV3 contains therein parts corresponding to V7, V8, V9, and LA7, LA8, LA9, and the bulb 3φV4 contains therein parts corresponding to V10, V11, V12, and LA10, AL11, LA12.

Characters 3φBUS1, 3φBUS2 designate 3-phase integral buses, phase rotary buses T1, T4 are connected to one ends of the buses through bushing, not shown, to transformers TR1, TR2 for a converter.

Phase rotary busesT3, T6 are respectively connected to the other ends of the buses 3φBUS1, 3φBUS2, and the above 3-arm integral type bulbs 3φV1 to 3φV4 are connected through bellows BE1, BE2 and BE3, BE4, and branch tubes BR1, BR2 and BR3, BR4 to the both sides of the phase rotary buses T3 and T6.

The thyristor bulbs for three arms contained therein and one ends of three lightning arresters are all connected at the D.C. bus side of the 3-arm integral type bulbs $3\phi V1$ to $3\phi V4$ to a conductor, and led through the buses passing through branch tubes BR5 to BR8. The branch tubes BR6, BR7 of them are respectively connected through disconnecting switch DS1, DS2 to a neutral D.C. bus line N. Lightning arresters LA13, LA14 for protecting reactors DCR1, DCR2 are connected through branch buses B, B1 to a bus passing through the branch tube BR5 of 3-arm integral type bulb $3\phi V1$ and a bus passing through the branch tube BR8 of 3-arm integral type bulb $3\phi V4$, respectively, and the other ends of the branch buses B1, B4 are rspectively connected to the reactors DCR1, DCR3. D.C. buses L1, L2 are respectively led from the reactors DCR1, DCR3.

Coolers CL1 to CL4 are respectively provided in the 3-phase integral type bulbs $3\phi V1$ to $3\phi V4$, and internal heats are externally dissipated through cooling medium such as oil or gas. The 3-phase integral type bulbs $3\phi V1$ to $3\phi V4$ are respectively placed on rails RL for leading the bulbs. When the 3-phase integral type bulb $3\phi V1$ is, for example, disassembled and inspected, the branch tube BR1, the bellows BE1 and the branch tube BR5, the branch bus B1 are respectively separated, and the bulb $3\phi V1$ is led out along the rail RL.

According to this invention as described above, the 3-phase integral type A.C. buses are associated with the 3-arm integral type bulbs containing the arresters, thereby simplifying the disposition of the buses and the thyristor bulbs and remarkably reducing the construction of the converting station. Further, in the embodiments described above, the enclosed containers for containing the thyristor bulbs are disposed substantially along the rectilinear line. Therefore, even if the entire station is reduced, the thyristor bulbs can be readily lead out for their inspection.

What is claimed is:

1. An enclosed D.C. converting station comprising:
   a thyristor group having a set of six thyristor bulbs for forming a 3-phase bridge circuit;
   lightning arresters respectively connected to the thyristor bulbs;
   series units each having two sets of the thyristor groups connected in series at D.C. side;
   D.C. buses respectively connected to positive (+), negative (−) and neutral polarity sides of said series units;
   3-phase A.C. buses respectively connected to the A.C. sides of said thyristor groups;
   3-arm integral type bulbs formed as one set having three said thyristor bulbs commonly connected at one end of the same polarity of the D.C. side of said thyristor groups and respectively contained together with said arresters in enclosed containers;
   wherein said 3-arm integral type bulbs are contained in four enclosed containers, and wherein said containers are disposed in a rectangular shape formed by connecting central points as seen from a plane.

* * * * *